US006437376B1

(12) United States Patent
Ozkan

(10) Patent No.: US 6,437,376 B1
(45) Date of Patent: Aug. 20, 2002

(54) HETEROJUNCTION BIPOLAR TRANSISTOR (HBT) WITH THREE-DIMENSIONAL BASE CONTACT

(75) Inventor: Cengiz S. Ozkan, LaJolla, CA (US)

(73) Assignee: Applied Micro Circuits Corporation, San Diego, CA (US)

( * ) Notice: Subject to any disclaimer, the term of this patent is extended or adjusted under 35 U.S.C. 154(b) by 0 days.

(21) Appl. No.: 09/516,993

(22) Filed: Mar. 1, 2000

(51) Int. Cl.[7] .................... H01L 31/072; H01L 31/109; H01L 31/0328; H01L 31/0336
(52) U.S. Cl. .................... 257/197; 257/592; 438/235
(58) Field of Search .................... 257/197, 592, 257/200, 34, 19; 438/235, 309, 312

(56) References Cited

U.S. PATENT DOCUMENTS

| 4,703,554 A | | 11/1987 | Havemann ............... 437/31 |
| 4,764,801 A | | 8/1988 | McLaughlin et al. ......... 357/59 |
| 5,006,912 A | * | 4/1991 | Smith et al. .................... 257/34 |
| 5,024,957 A | * | 6/1991 | Harame et al. .............. 438/31 |
| 5,166,767 A | | 11/1992 | Kapoor et al. .............. 257/518 |
| 5,308,444 A | | 5/1994 | Fitzgerald, Jr. et al. ....... 117/90 |
| 5,440,152 A | * | 8/1995 | Yamazaki .................... 257/197 |
| 5,629,556 A | * | 5/1997 | Johnson ........................ 257/592 |
| 5,668,022 A | | 9/1997 | Cho et al. .................... 438/320 |
| 6,169,007 B1 | * | 1/2001 | Pinter ........................ 257/197 |
| 6,281,097 B1 | * | 8/2001 | Aoyama ..................... 257/197 |

OTHER PUBLICATIONS

A. Samelis et al, "Large–Signal Characteristics of InP–Based Heterojunction Bipolar Transistors and Opto–electronic Cascode Transimpedance Amplifiers", *IEEE Trans. On Electron Devices*, vol. 43, No. 12, 12/96.

K. Washio et al, "95GHz $f_T$ Self–Aligned Selective Epitaxial SiGe HBT with SMI Electrodes" *ISSCC / © IEEE* 1998, p. 19–6–1 to 19.6–11.

Presentation by Prof. John D. Cressler, "Silicon–Germanium Microelectronics: The Next Leap in Silicon?" *IEEE May Meeting Announcement*, Jan. 28, 2000.

* cited by examiner

Primary Examiner—Hoai V. Ho
Assistant Examiner—Andy Huynh
(74) Attorney, Agent, or Firm—Gray Cary Ware & Freidenrich

(57) ABSTRACT

A Heterojunction Bipolar Transistor (HBT) is provided which is formed by selectively depositing silicon germanium (SiGe) in a base region subsequent to the deposition of the base electrodes. Vertical bridging structures of SiGe are formed in the intrinsic area of the base to connect to the base electrode. During the formation of the dielectric sidewall defining the emitter space the SiGe base region is protected with a thin coat of oxide formed in a high-pressure low-temperature oxidation (HIPOX) process. Prior to the emitter silicon deposition the HIPOX is removed. A method for forming an HBT with a vertical bridging structure, as described above, is also provided.

11 Claims, 9 Drawing Sheets

↑ decreasing Ge content

↑ decreasing Ge content

HETEROJUNCTION BIPOLAR TRANSISTOR (HBT) WITH THREE-DIMENSIONAL BASE CONTACT

BACKGROUND OF THE INVENTION

This invention generally concerns Heterojunction Bipolar Transistors (HBT)s and, more particularly, a HBT device with an intrinsic, merged growth base electrode contact formed through the selective deposition of silicon germanium (SiGe) in the base region.

Rapid progress has occurred in the development of high performance bipolar and BiCMOS integrated circuits for applications such as high speed data and RF wireless communications. SiGe heterojunction bipolar technology offers economically feasible solutions with comparable performance characteristics to III–V technologies. The critical performance criteria include high frequency performance, low noise at both low and high frequency, sufficiently high intrinsic gain, and high breakdown voltages.

The integration of SiGe into the silicon bipolar base processing has been of interest because of the resulting improvements in electrical properties such as transmit frequency (Ft), Early voltage (Va), and collector-to-emitter breakdown (BVceo). The band gap at the collector side can be reduced by substituting germanium (Ge) for silicon (Si) in the base region of a bipolar transistor. This results in an electric field in the base, which reduces the majority carriers transit time. SiGe films can be integrated into silicon processing with much less difficulty than other materials. However, even the use of structurally similar materials, such as Si and Ge, results in lattice mismatches on the crystal boundary area. Further, the formation of very thin base regions is complicated by the fact that boron implantation, even at an energy as low as 5 Kev, can still penetrate 1000 Å into the base collector junction.

Different techniques have been proposed to integrate SiGe into the base of a bipolar device. These techniques are classified into two categories: blanket SiGe film deposition and selective SiGe film deposition. The blanket SiGe deposition method produces less silicon defects, and, therefore, higher yields. Thin, heavily doped, film can be produced with this method using growth rates of 25 to 100 Å per minute. However, blanket deposition processes are difficult to integrate into standard bipolar fabrication processes. Undesired areas of SiGe cannot easily be etched away without damaging the thin, intended base region. Although nonselective deposition is less complicated in terms of nucleation, microloading effects and faceting, it has to be done at an earlier state in the front-end fabrication sequence for patterning purposes. The stability of the film is frequently compromised due to the number of thermal cycling and etching steps, causing excessive dopant out-diffusion and defect formation.

Alternately, selective deposition techniques can be used to form base electrode and base region underlying the emitter. Selective deposition processes can be used to grow SiGe only on silicon areas, so that the process is self-aligned. Selective deposition can be done at a later stage which makes its integration much less complicated. The process is less complicated because post deposition patterning is not required, the process is self-aligned, and extraneous thermal cycles are avoided. Although selective SiGe film deposition is conceptually simple, there are problems concerning the connection of the SiGe base to the base electrodes, and with defect formation near the emitter-base junction. However, if these particular problems could be solved, the selective deposition of SiGe in the fabrication of HBTs would result in higher yields and better electrical performance.

It would be advantageous if an HBT base region could be reliably fabricated using a selective SiGe deposition, at a later stage in the fabrication sequence, to minimize exposure of the SiGe layer to undesired heat cycles and chemical processes.

It would be advantageous if a SiGe base could be self-aligned, and formed without the necessity of post-deposition patterning.

It would be advantageous if a selectively deposited SiGe base could be formed subsequent to the formation of the base electrode layer, so as to avoid annealing and chemical etch processes which degrade a SiGe film.

It would be advantageous if a selectively deposited SiGe base could be protected during the formation of the emitter window to prevent defects along the emitter-base junction.

It would be advantageous if contacts could be formed between a silicon base electrode and a selectively deposited SiGe bas region without the requirement of special processes or extrinsic connections.

SUMMARY OF THE INVENTION

Accordingly, a method for fabricating a Heterojunction Bipolar Transistor (HBT) is provided comprising:

forming a silicon base electrode insulated from a collector;

forming an emitter window through the silicon base electrode and insulator, exposing the collector region;

selectively depositing silicon germanium (SiGe) in the emitter window; and forming a SiGe three-dimensional contact from the base region to the base electrode.

Preceding the formation of the base electrode, a gate oxide layer is deposited overlying the collector. Further processes deposit a first layer of oxide overlying the gate oxide layer, forming the insulator separating the collector from the base electrode. Then, the formation of the HBT comprises:

pattern etching the base electrode to reveal an area of the first oxide layer and exposing base electrode sidewall surfaces; and pattern etching to remove the first oxide layer and gate oxide layer, revealing a collector region and forming oxide sidewalls.

growing SiGe on the collector top surface;

growing SiGe on exposed base electrode sidewalls;

merging the SiGe grown on the collector with the SiGe grown on the base electrode sidewall across the oxide sidewalls. The SiGe merger creates a vertical bridge contact between the areas of grown SiGe.

Optionally, the selective deposition of SiGe, includes forming a bottom cap layer of silicon to separate the collector from the SiGe bottom surface; and following the selective deposition of SiGe, depositing a top cap layer of silicon overlying the SiGe top surface, forming the base region top surface.

Further processes comprise:

forming a protective oxide layer overlying the base region top surface;

forming dielectric sidewalls;

removing the protective oxide layer overlying the intrinsic base region after the formation of the dielectric sidewalls; and forming an emitter.

A Heterojunction Bipolar Transistor is also provided comprising a lightly doped collector region and a base region including silicon germanium (SiGe). A base electrode overlies the collector, and a three-dimension SiGe contact connects the base region and the base electrode. A protective oxide layer temporarily overlies the base region.

A first oxide layer has sidewalls adjacent the base region, and the three-dimensional SiGe contact is formed along the gate oxide and first oxide layer sidewalls. The three-dimensional contact includes a first SiGe interface to the collector top surface, a second SiGe interface to the base electrode sidewalls, and a vertical bridge merging the first and second SiGe interfaces adjacent the oxide sidewalls.

BRIEF DESCRIPTION OF THE DRAWINGS

FIGS. 1–5 are partial cross-sectional illustrations of the formation of a completed Heterojunction Bipolar Transistor (HBT) of the present invention.

DETAILED DESCRIPTION OF THE PREFERRED EMBODIMENT

In following description, manufacturing steps are described with enough detail to show relationships between elements of the completed device. Many fabrication details are omitted from this description, with the understanding that those skilled in the art may employ as many of those details as are called for in any particular design. Moreover, when description is given in this application of fabrication steps, those skilled in the art will realize that each such step may actually comprise one or more discrete steps and that other steps, not described herein, may be necessary to achieve specific applications of the invention.

Figure 1:
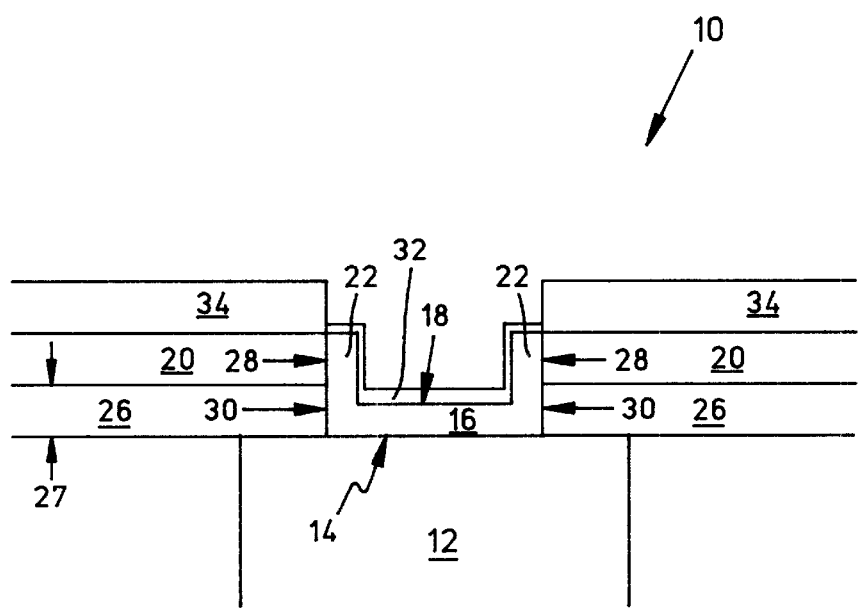

FIGS. 1–5 are partial cross-sectional illustrations of the formation of the completed Heterojunction Bipolar Transistor (HBT) of the present invention. FIG. 1 depicts a partially formed HBT 10. HBT 10 comprises a lightly doped collector region 12 having a top surface 14. A base region 16, including silicon germanium (SiGe), has a top surface 18 overlying the collector 12. A base electrode 20 overlies the collector 12. A three-dimensional SiGe contact 22 connects the base region 16 and the base electrode 20.

A first oxide layer 26 overlies a gate oxide layer 24. The first oxide layer 26 is formed with a chemical vapor deposition (CVD) process to a thickness 27 of 100 Å to 250 Å. The base electrode 20 overlies the first oxide layer 26.

Further, the base electrode 20 has sidewalls 28 which are exposed surfaces intrinsic to the base region 16. The first oxide 26 layer has sidewalls 30 adjacent the base region 16. The three-dimensional SiGe contact 22 is formed along the first oxide layer sidewalls 30 to connect to intrinsic surfaces 28 of the base electrode 20. A protective oxide layer 32 overlies the base region top surface 18. A first nitride layer 34 overlying the base electrode layer 20.

Figure 2:
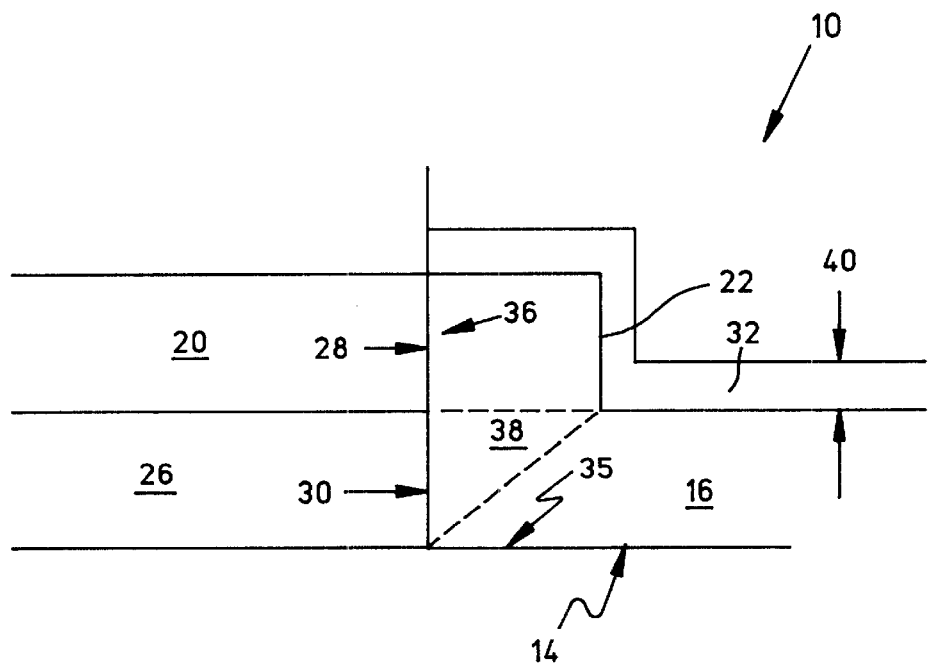

FIG. 2 is a more detailed depiction of the HBT 10 of FIG. 1, featuring the three-dimensional contact 22. The three-dimensional contact 22 includes a first SiGe interface 35 to the collector top surface 14, and a second SiGe interface 36 to the base electrode sidewalls 28. A vertical bridge, or merger structure 38, defined between the dotted lines and oxide sidewall 30, merges the first and second SiGe interfaces 35 and 36 adjacent the oxide sidewalls 30. The protective oxide layer 32 has a thickness 40 in the range of 50 Å to 250 Å.

Figure 3:
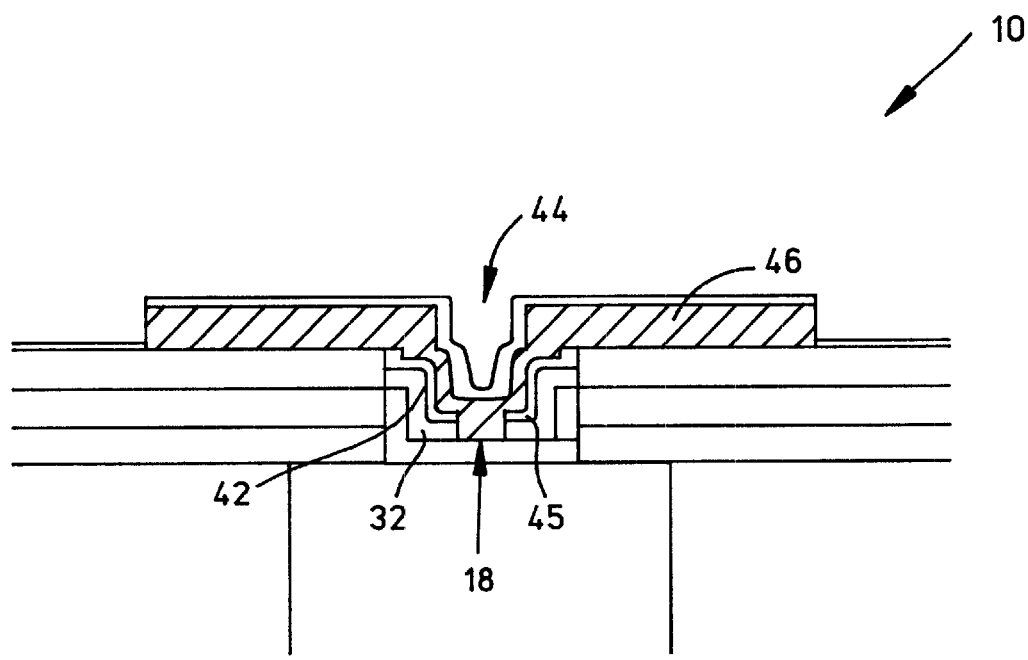

FIG. 3 depicts the HBT 10 of FIG. 2 with dielectric sidewalls. Dielectric sidewalls 42 are formed to define an emitter window 44. The formation of the emitter window 44 includes pattern etching nitride layer 45 and oxide layer 32. An emitter 46 is formed in the emitter window 44 overlying the base region top surface 18. The protective oxide layer 32 is selectively, or partially removed in the formation of the dielectric sidewalls 42, before the formation of the emitter 46.

FIG. 4 depicts the HBT 10 of FIG. 3 featuring the base region 16. The base region 16 includes a SiGe bottom surface 50 overlying the collector 12 and a SiGe top surface 52 underlying the emitter 46. In some aspects of the invention the Ge content progressively decreases from the SiGe bottom surface 50 to the SiGe top surface 52. The Ge content of the SiGe varies in the range from 0 to 20%. In a preferred aspect, the Ge content varies progressively decreases from 12% at the SiGe bottom surface 50 to 0% Ge content at the SiGe top surface 52.

FIG. 5 depicts the base region 16 of FIG. 4 with optional Si-caps caps. A silicon bottom cap layer 54 separates the collector 12 from the SiGe bottom surface 50. A silicon top cap 56 layer overlies the SiGe top surface 52, forming the base region top surface 16. In some aspects of the invention the Ge content is progressively graded, as described above.

Figure 6:
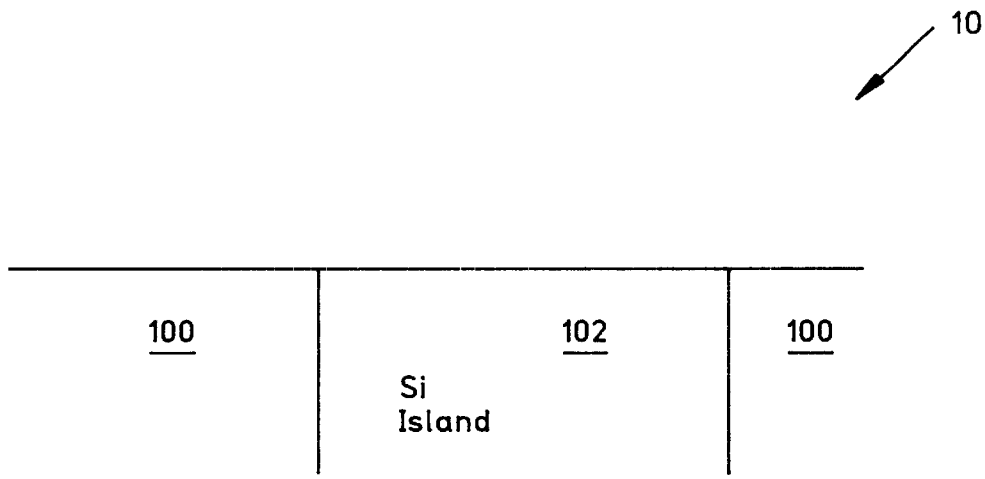
FIGS. 6–12 depict detailed steps in the formation of a completed HBT device in accordance with the present invention.

FIGS. 6–11 depict detailed steps in the formation of a completed HBT device 10 in accordance with the present invention. FIG. 6 depicts a conventional front-end bipolar process (prior art). An N+ buried layer is formed via a dopant implant of arsenic or antimony and a high temperature drive. An N-Epi layer is deposited and doped in-situ with arsenic to form collector region. Device isolation is achieved by forming deep and shallow trenches 100. Deep trench isolation is conducted first, and consists of forming deep and high aspect ratio grooves in the silicon 5–10 microns deep. The walls of deep trenches 100 are oxidized to a thickness of 500–1500 Å, and then the trenches are filled with poly-silicon. Planarization is made via blanket etch-back of the poly-silicon layer or using chemo-mechanical polish (CMP). The oxide is wet etched, and a stack of nitride (500–2000 Å)/oxide (250–1000 Å) layers is deposited and patterned. Shallow trenches 100 are etched (1–2 microns) and then the trench walls are oxidized (500–1500 Å). Next, nitride is removed by wet etching and the trenches 100 are filled with tetraethylorthosilicate (TEOS). Planarization is made by a combination of resist etchback and spin-on glass (SOG) etchback to expose the device areas.

Figure 7:
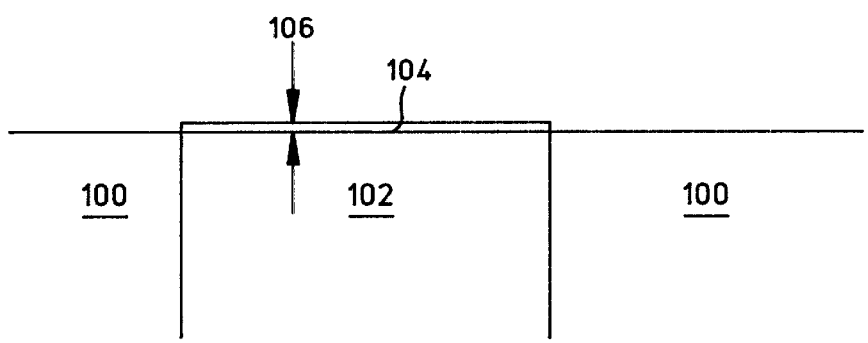

FIG. 7 illustrates the HBT 10 of FIG. 6 following the deposition of a thin gate oxide 104 (prior art). The gate oxide 104 is grown to a thickness 106 of 20–200 Å.

Figure 8:
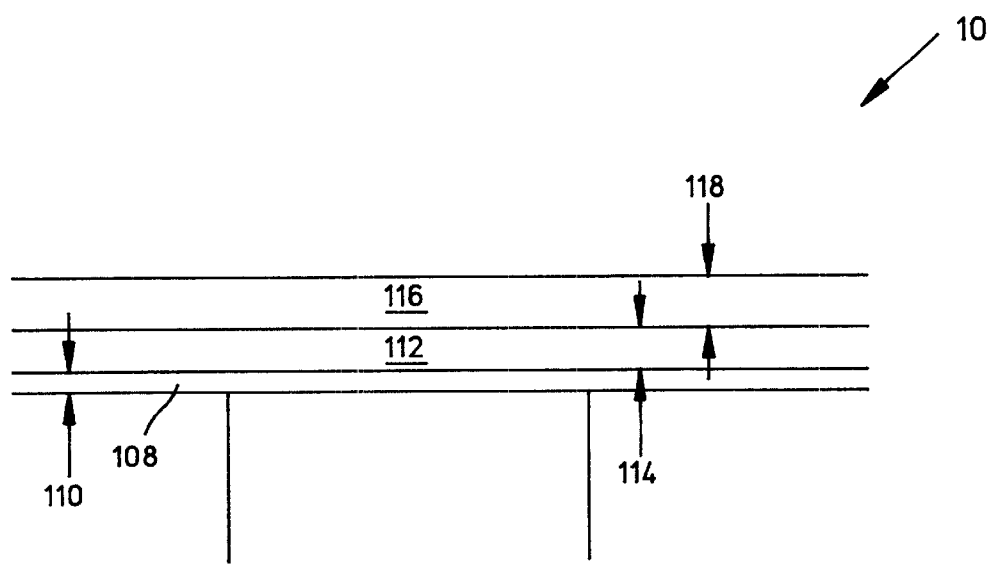

FIG. 8 illustrates the HBT 10 of FIG. 7 following the formation of a the first (CVD) oxide deposition 108. The first oxide layer 108 has a thickness 110 in the range of 100 Å to 250 Å. After that, a stack of poly-silicon 112, having a thickness 114 of 1000 Å to 3000 Å, and CVD nitride 116, having a thickness 118 of 1000 Å to 4000 Å is deposited. Note, gate oxide layer 104 is not shown in the interest of clarity.

Figure 9:
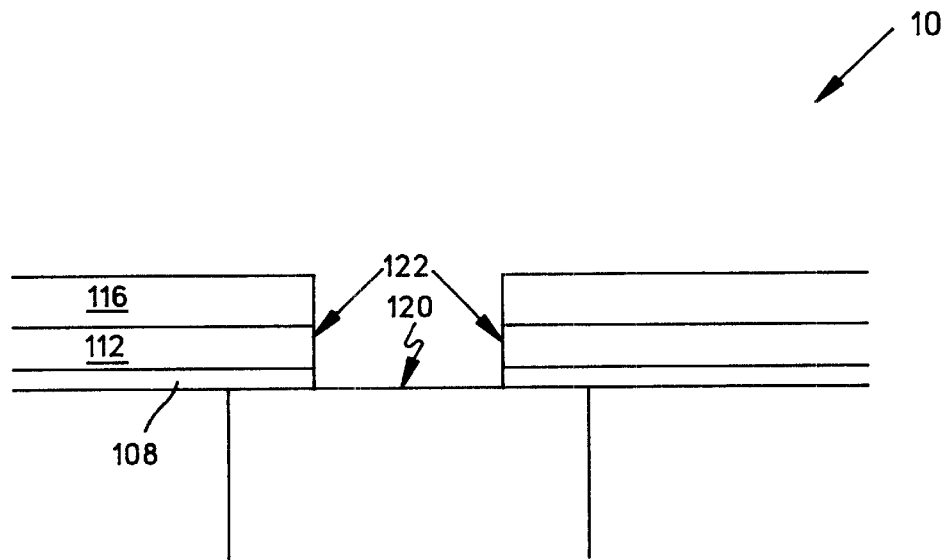

FIG. 9 illustrates the HBT 10 of FIG. 8 following emitter window patterning. The nitride layer 116 is etched in plasmas using $CF_4/CHF_3$ chemistry, and then the poly-silicon layer 112 is etched using $Cl_2$ chemistry. Photoresist is stripped and then the thin first oxide layer 108 over the device areas is wet etched in 10:1 (DI:HF). Silicon surfaces are exposed, namely, the collector top surface 120 and base electrode sidewalls 122. Wet etching of the first, or sacrificial oxide 108 is conducted immediately prior to SiGe deposition to ensure passivation of the exposed Silicon regions 120 and 122. Oxide sidewalls 124 are also created.

Figure 10:
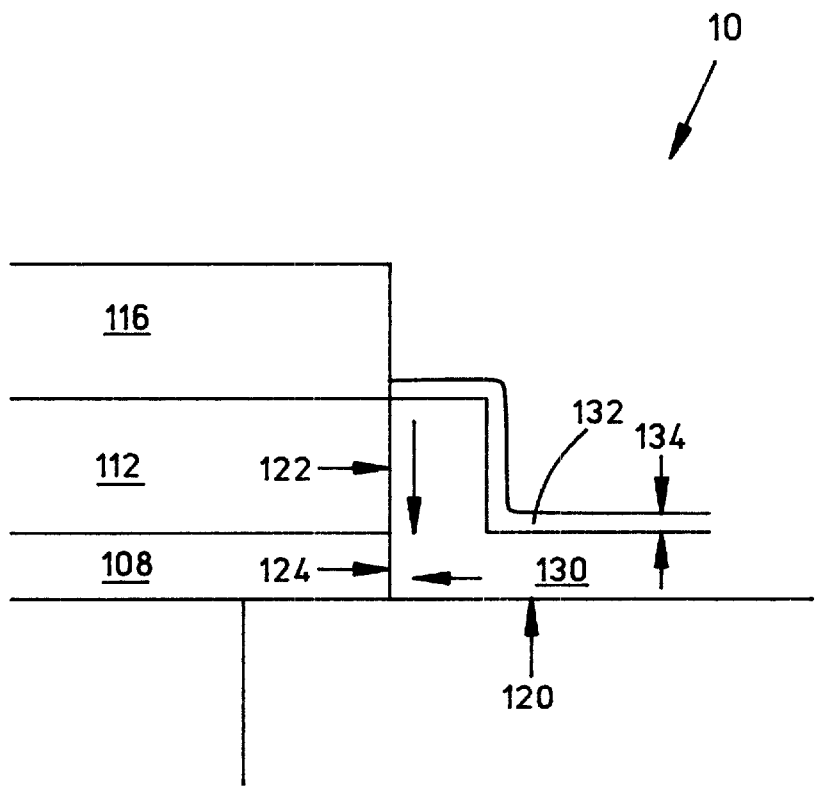

FIG. 10 illustrates the HBT of FIG. 9 following the selective deposition of SiGe 130. The deposition of SiGe 130 is conducted using a DCS (dichlorosilane) or $DCS/Cl_2$ chemistry, which prevents nucleation over dielectrics, such as oxide layer 108. As is well known, selective SiGe deposition consists of depositing a stack of Si-cap/intrinsic SiGe/Boron doped SiGe/intrinsic SiGe/Si-cap layers. The SiGe layers are either graded or fixed (box profile) in germanium content. The thickness, germanium content, profile (box or graded) and the boron doping level are extremely important in determining the final electrical properties of the device. The present invention is enabled with all convention doping techniques used to form base electrodes.

SiGe deposition takes place over the exposed island silicon surfaces as well as on the poly-silicon side walls. The SiGe 130 nucleates on Si and poly-Si surfaces 120 and 122 and merges over the thin oxide layer 108, as represented by the arrows. The DCS and chlorine chemistries helps insure that, even though SiGe 130 does not grow on the sidewalls 124 of the first oxide layer 108, the gaps or cavities between the SiGe 130 and oxide sidewalls 124 remain less than 200 Å, so that the device performance is not effected.

The top Si-cap layer (see FIG. 5 for details) is then oxidized to form an oxide layer 132 having a thickness 134 of 50 Å to 250 Å. A high pressure-low temperature oxidation (HIPOX), at 10–25 atm and a temperatures of 600–700 degrees C., forms oxide layer 132 for protection purposes. Alternately, a thin CVD oxide can be deposited.

Figure 11:
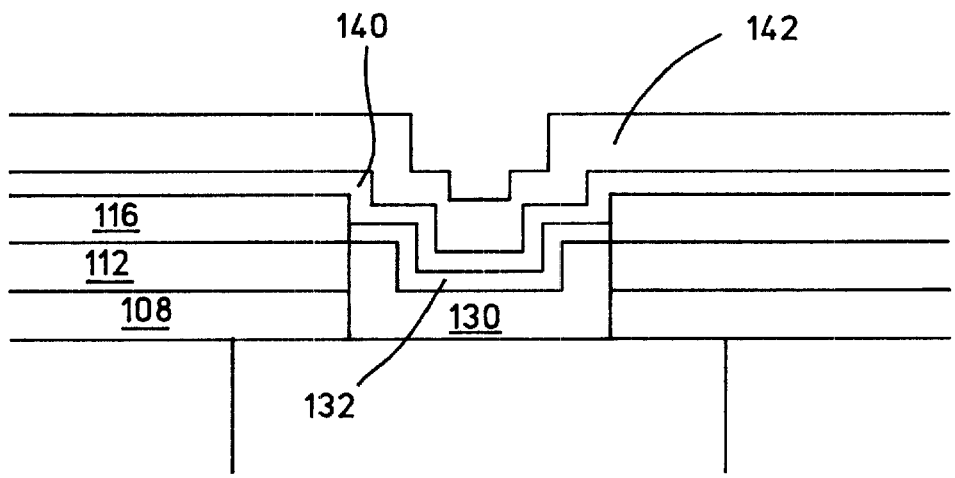

FIG. 11 illustrates the HBT 10 of FIG. 10 with dielectric sidewalls. A second nitride layer 140 is blanket deposited over all the surfaces including the protective oxide layer 132. Dielectrics 140 and 132 form the spacer defined as the dielectric sidewall 42 in FIG. 3. An amorphous poly-Si layer 142 is blanket deposited to a thickness of about 4000 Å. Spacer 140/132 is used to prevent emitter plugging effects when using arsenic implant for doping the emitter poly-silicon layer 144.

Figure 12:
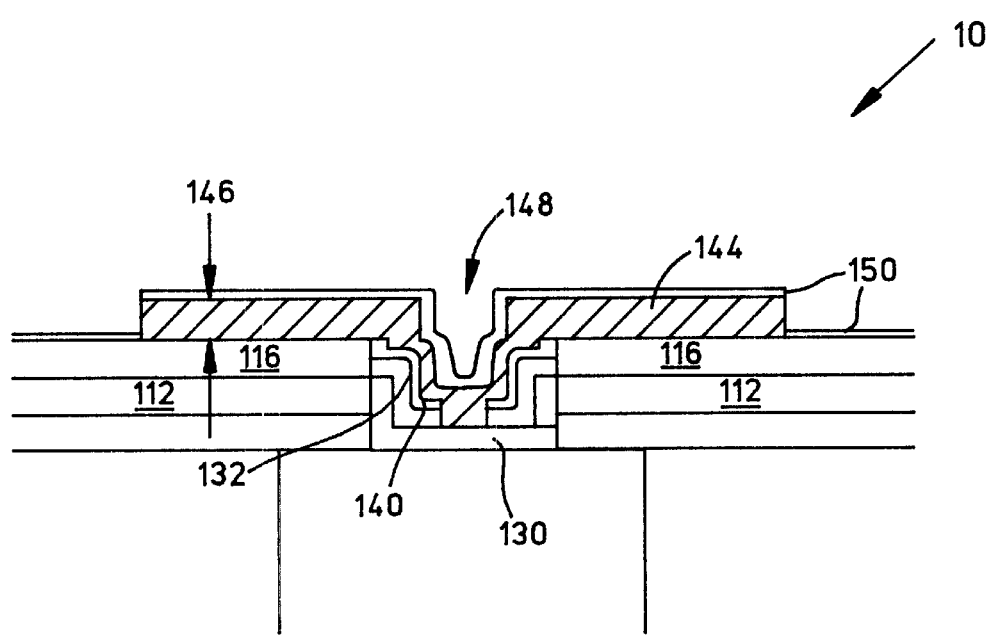

FIG. 12 is the HBT 10 of FIG. 11 in completed form. After etching poly-Si 142 (see FIG. 11) and nitride 140, HIPOX layer 132 is wet etched by a quick HF dip so that the emitter window reveals SiGe base 130. Emitter poly-silicon 144 is deposited to a thickness 146 of 1500 Å to 2500 Å. Arsenic is then implanted (1e16 to 2e16 at/$cm^2$ dose) followed by thin CVD nitride deposition (500–1500 Å). A furnace anneal is then performed to drive the emitter dopant (675–775 degrees C.) followed by a rapid thermal anneal for dopant activation (900–975 degrees C.). The emitter window 148 is patterned and the poly-silicon 144/nitride 116 stack is etched to expose the base poly-silicon layer 112. This is followed by platinum deposition 150 and furnace silicidation anneal. The non-reacted platinum is wet etched in Aqua Regia solution.

Figure 13A:
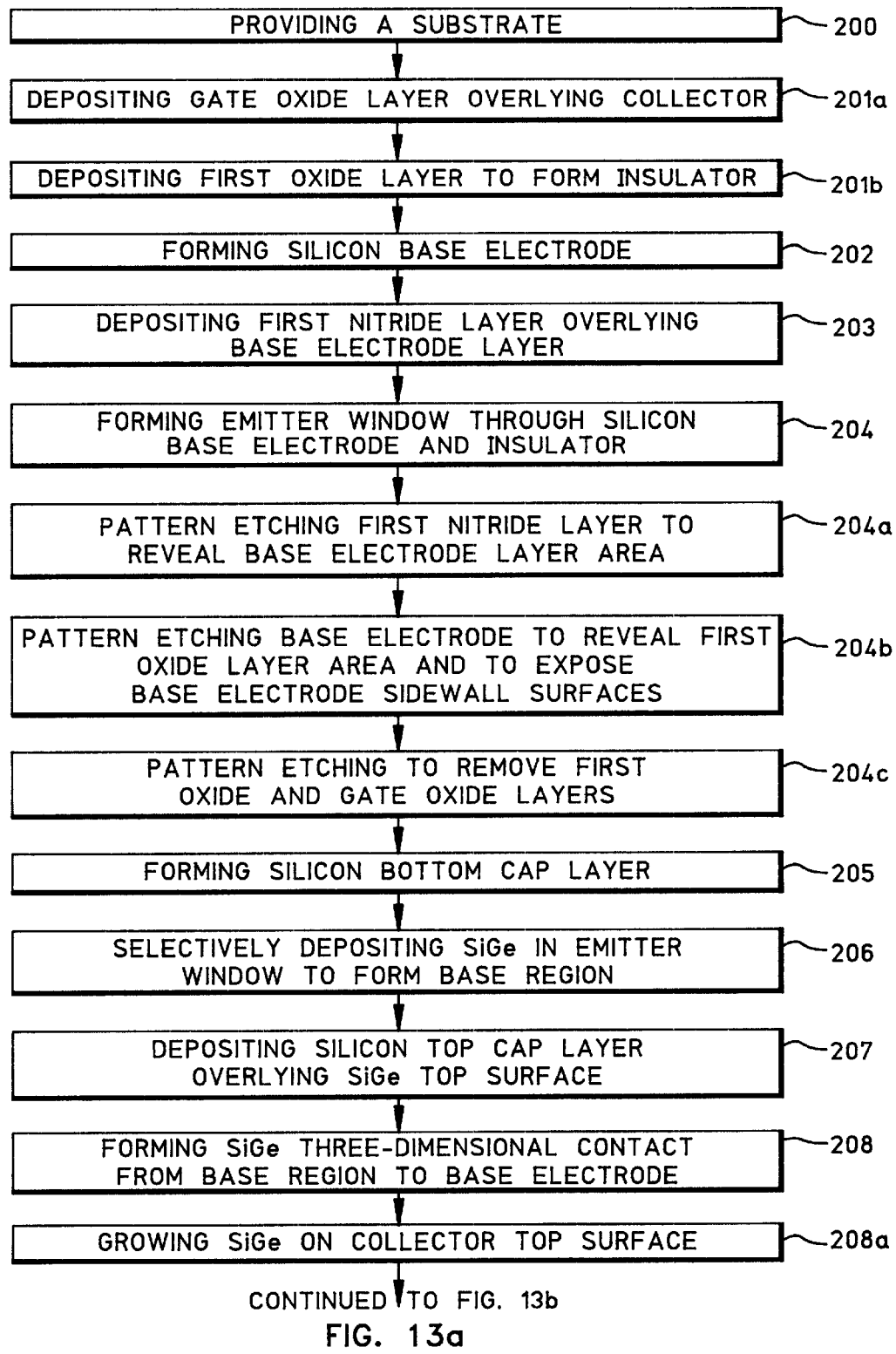
FIG. 13 is a flowchart illustrating a method for fabricating a Heterojunction Bipolar Transistor (HBT).
Figure 13B:
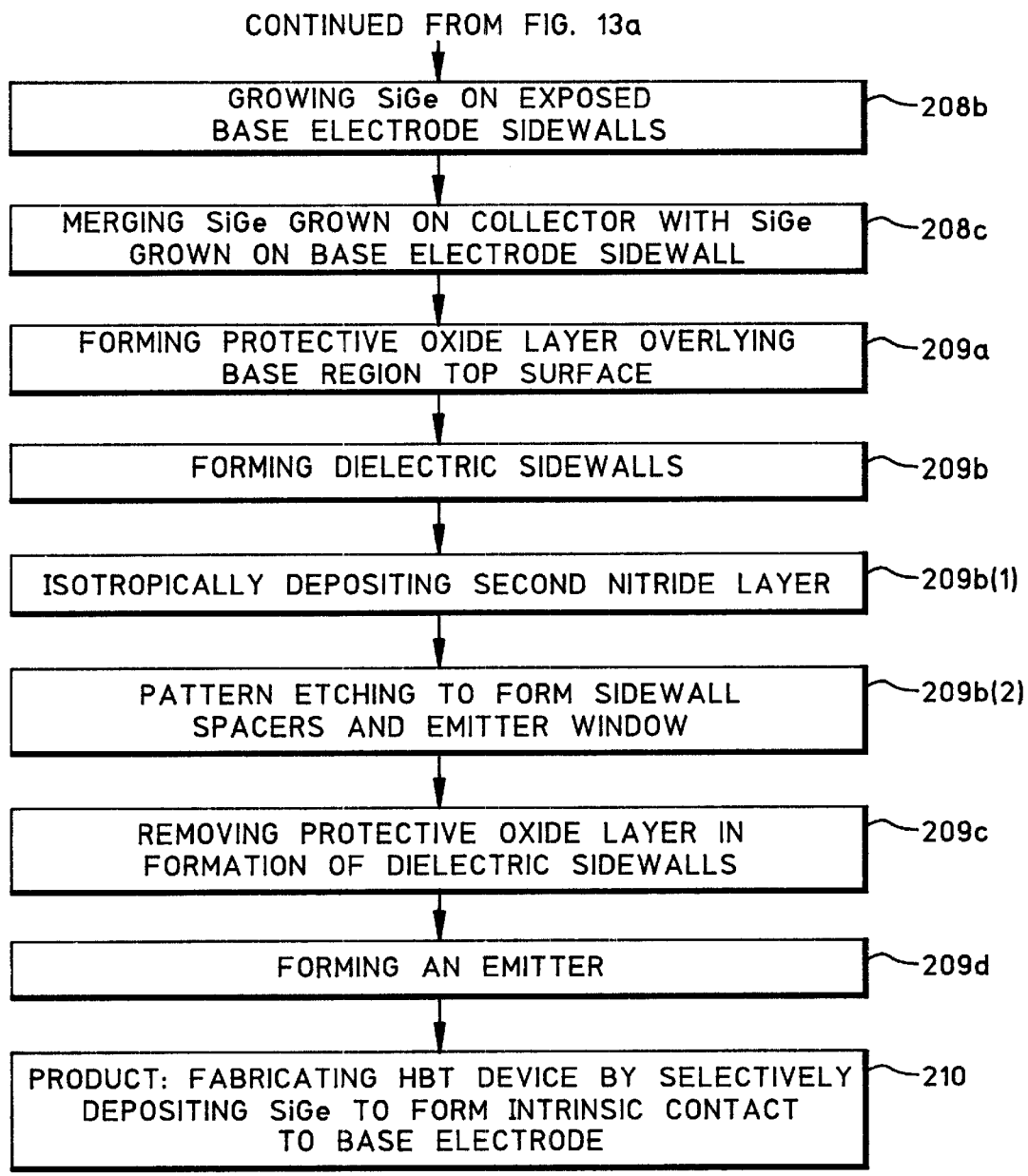

FIG. 13 is a flowchart illustrating a method for fabricating a Heterojunction Bipolar Transistor (HBT). Although the method is described as a series of numbered steps for the purpose of clarity, no order should be inferred from the numbering unless explicitly stated. Step 200 provides a substrate including a lightly doped collector top surface. Step 202 forms a silicon base electrode insulated from a collector region top surface. Step 204 forms an emitter window through the silicon base electrode and insulator, exposing the collector region. Step 206 selectively deposits silicon germanium (SiGe) in the emitter window overlying the collector to form a base region with a top surface. Step 208 forms a SiGe three-dimensional contact from the base region to the base electrode. Step 210 is a product, where an HBT device is fabricated by selectively depositing SiGe to form an intrinsic contact to the base electrode.

The formation of the base region three-dimensional contact in Step 208 includes sub-steps. Step 208a grows SiGe on the collector top surface. Step 208b grows SiGe on exposed base electrode sidewalls. Step 208c merges the SiGe grown on the collector with the SiGe grown on the base electrode sidewall across the oxide sidewalls of the first oxide layer. The SiGe merger in Step 208c creates a vertical bridge, or three-dimensional contact between the areas of grown SiGe.

Step 209a forms a protective oxide layer overlying the base region top surface. The protective oxide layer is typically formed by oxidizing the base region top surface at a temperature in the range of 600 to 700 degrees C., and a pressure in the range of 10–25 atmospheres. Step 209b forms dielectric sidewalls. The formation of dielectric sidewalls in Step 209b includes sub-steps. Step 209b(1) isotropically deposits a second layer of nitride. Step 209b(2) pattern etches to form sidewall spacers and an emitter window, revealing the base region top surface. Step 209c selectively removes protective oxide layer in the formation of the dielectric sidewalls. That is, the protective oxide overlying intrinsic areas of the base-emitter contact region are removed. The pattern etching of the emitter window to remove regions of the protective oxide layer includes using an HF wet etch procedure.

Step 209d forms an emitter. The formation of the emitter in Step 209d includes sub-steps (not shown). Step 209d(1) deposits silicon in the emitter window. Step 209d(2) dopes the emitter. Step 209d(3) anneals the emitter. Step 209d(4) patterns the emitter, and Step 209d(5) forms emitter and base electrode contacts.

Preceding the formation of the base electrode in Step 202, Step 201a deposits a gate oxide layer overlying the collector. Step 201b deposits a first layer of oxide, forming the insulator separating the collector from the base electrode. The first oxide layer is formed through a chemical vapor deposition (CVD) process. Then, the formation of the base electrode in Step 202 includes depositing a layer of silicon overlying the first oxide layer.

Preceding the formation of the emitter window in Step 204, Step 203 deposits a first nitride layer overlying the base electrode layer. Then, the formation of the emitter window in Step 204 includes sub-steps. Step 204a pattern etches the first nitride layer to reveal an area of the base electrode layer. Step 204b pattern etches the base electrode to reveal an area of the first oxide layer and exposing base electrode sidewall surfaces. Step 204c pattern etches to remove the first oxide layer and gate oxide layer, revealing a collector region and forming oxide sidewalls.

With respect to Step 206, the selective deposition of SiGe includes depositing SiGe through chemistries selected from the group consisting of dichlorosilane (DCS) and $DCS/Cl_2$. Further, the selective deposition of SiGe includes selectively grading the Ge content in the SiGe base region during deposition. The Ge content of the SiGe varies in the range from 0 to 20%. In one aspect of the invention, wherein the base region includes a SiGe bottom surface adjacent the collector and a SiGe top surface, the selective deposition of SiGe in Step 206 includes varying the Ge content progressively from 12% at the SiGe bottom surface to 0% Ge content at the SiGe top surface.

In some aspects of the invention, preceding the selective deposition of SiGe in Step 206, Step 205 forms a bottom cap layer of silicon to separate the collector from the SiGe bottom surface. Following the selective deposition of SiGe in Step 206, Step 207 deposits a top cap layer of silicon overlying the SiGe top surface, forming the base region top surface.

While only certain preferred features of this invention have been shown by way of illustration, many changes and modifications will occur to those skilled in the art. Accordingly, it is to be understood that the appended claims are intended to cover all such modifications and changes as fall within the true spirit and scope of the invention.

What is claimed is:

1. A heterojunction bipolar transistor (HBT) comprising:
   a lightly doped collector region having a top surface;
   a base electrode overlying the collector,
   an emitter;
   a silicon germanium (SiGe) base region comprising a silicon top cap layer underlying the emitter and a silicon bottom cap layer overlying the collector, the SiGe base region having a Germanium (Ge) content progressively decreasing from the silicon bottom layer to the silicon top layer; and
   a three-dimensional SiGe contact comprising a vertical bridge connecting a first interface adjacent to the collector to a second interface adjacent to the base electrode to connect the base region to the base electrode.

2. The HBT of claim 1 further comprising:
   a first oxide layer overlying the collector in regions extrinsic to the base region;
   in which the base electrode overlies the first oxide layer, and in which the base electrode has sidewalls;
   in which the oxide layer have sidewalls adjacent the base region; and
   in which the three-dimensional SiGe contact is formed along the first oxide layer sidewalls.

3. The HBT of claim 2 in which the three-dimensional contact includes:
   a first SiGe interface to the collector top surface;
   a second SiGe interface to the base electrode sidewalls; and
   a vertical bridge merging the first and second SiGe interfaces adjacent the first oxide sidewalls.

4. The HBT of claim 2 further comprising:
   a protective oxide layer temporarily overlying the base region top surface;
   dielectric sidewalls formed to define an emitter window;
   an emitter, formed in the emitter window overlying the base region top surface; and
   in which the protective oxide layer is selectively removed after the formation of the dielectric sidewalls, and before the formation of the emitter.

5. The HBT of claim 4 in which the protective oxide layer has a thickness in the range of 50 Å to 250 Å.

6. The HBT of claim 4 further comprising:
   a first nitride layer overlying the base electrode layer; and
   in which the formation of the emitter window includes pattern etching the first nitride layer, the first oxide layer, and gate oxide layer.

7. The HBT of claim 1 in which the Ge content of the SiGe varies in the range from 0 to 20%.

8. The HBT of claim 7 in which Ge content varies progressively decreases from 12% at the SiGe bottom surface to 0% Ge content at the SiGe top surface.

9. The HBT of claim 4 in which the dielectric sidewalls include:
   a second layer of nitride overlying the protective oxide layer; and
   in which the second nitride layer and protective oxide layer are pattern etched to from sidewall spacers and an emitter widow revealing the base region top surface.

10. The HBT of claim 2 in which the gate oxide has a thickness in the range of 20 Å to 200 Å.

11. The HBT of claim 2 in which the first oxide layer is formed with a chemical vapor deposition (CVD) process to a thickness of 100 Å to 250 Å.

* * * * *